(12) United States Patent
Peidous et al.

(10) Patent No.: US 11,594,446 B2
(45) Date of Patent: *Feb. 28, 2023

(54) HIGH RESISTIVITY SOI WAFERS AND A METHOD OF MANUFACTURING THEREOF

(71) Applicant: GlobalWafers Co., Ltd., Hsinchu (TW)

(72) Inventors: Igor Peidous, Eaton, OH (US); Srikanth Kommu, St. Charles, MO (US); Gang Wang, St. Peters, MO (US); Shawn George Thomas, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/359,848

(22) Filed: Jun. 28, 2021

(65) Prior Publication Data

US 2021/0327750 A1    Oct. 21, 2021

Related U.S. Application Data

(63) Continuation of application No. 16/948,376, filed on Sep. 16, 2020, now Pat. No. 11,081,386, which is a (Continued)

(51) Int. Cl.
*H01L 21/762* (2006.01)
*H01L 21/02* (2006.01)

(52) U.S. Cl.
CPC .. *H01L 21/76251* (2013.01); *H01L 21/76254* (2013.01)

(58) Field of Classification Search
CPC ............... H01L 21/76251; H01L 21/76254
See application file for complete search history.

(56) References Cited

U.S. PATENT DOCUMENTS

| 4,501,060 A | 2/1985 | Frye et al. |
| 4,755,865 A | 7/1988 | Wilson et al. |

(Continued)

FOREIGN PATENT DOCUMENTS

| EP | 0939430 A2 | 1/1999 |
| EP | 1865551 A1 | 12/2007 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

(Continued)

*Primary Examiner* — Christine A Enad
(74) *Attorney, Agent, or Firm* — Armstrong Teasdale LLP

(57) ABSTRACT

A high resistivity single crystal semiconductor handle structure for use in the manufacture of SOI structure is provided. The handle structure comprises an intermediate semiconductor layer between the handle substrate and the buried oxide layer. The intermediate semiconductor layer comprises a polycrystalline, amorphous, nanocrystalline, or monocrystalline structure and comprises a material selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, group IIIA-nitrides, semiconductor oxides, and any combination thereof.

22 Claims, 3 Drawing Sheets

Related U.S. Application Data continuation of application No. 16/058,550, filed on Aug. 8, 2018, now Pat. No. 10,910,257, which is a continuation of application No. 15/112,083, filed as application No. PCT/US2014/072546 on Dec. 29, 2014, now Pat. No. 10,079,170.

(60) Provisional application No. 61/930,507, filed on Jan. 23, 2014.

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 6,043,138 | A | 3/2000 | Ibok |
| 6,373,113 | B1 | 4/2002 | Gardner et al. |
| 6,562,127 | B1 | 5/2003 | Kud et al. |
| 6,624,047 | B1 | 9/2003 | Sakaguchi et al. |
| 7,262,465 | B2 | 8/2007 | Hatada et al. |
| 7,420,226 | B2 | 9/2008 | Augustine et al. |
| 7,868,419 | B1 | 1/2011 | Kerr et al. |
| 7,879,699 | B2 | 2/2011 | Schulze et al. |
| 7,915,716 | B2 | 3/2011 | Pisigan et al. |
| 8,058,137 | B1 | 11/2011 | Or-Bach et al. |
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 10,079,170 | B2 * | 9/2018 | Peidous ............ H01L 21/76251 |
| 10,910,257 | B2 * | 2/2021 | Peidous ............ H01L 21/76251 |
| 11,081,386 | B2 * | 8/2021 | Peidous ............ H01L 21/76254 |
| 2002/0090758 | A1 | 7/2002 | Henley et al. |
| 2003/0022412 | A1 | 1/2003 | Higgins et al. |
| 2004/0005740 | A1 | 1/2004 | Lochtefeld et al. |
| 2004/0031979 | A1 | 2/2004 | Lochtefeld et al. |
| 2004/0108537 | A1 | 6/2004 | Tiwari |
| 2005/0153524 | A1 | 7/2005 | Maa et al. |
| 2005/0167002 | A1 | 8/2005 | Ghyselen et al. |
| 2006/0030124 | A1 | 2/2006 | Maa et al. |
| 2006/0033110 | A1 | 2/2006 | Alam et al. |
| 2006/0163557 | A1 | 7/2006 | Hatada et al. |
| 2006/0226482 | A1 | 10/2006 | Suvorov |
| 2007/0023808 | A1 | 2/2007 | Specht et al. |
| 2007/0032040 | A1 | 2/2007 | Lederer |
| 2007/0054466 | A1 | 3/2007 | Hebras |
| 2008/0149989 | A1 | 6/2008 | Cheng et al. |
| 2008/0171443 | A1 | 7/2008 | Hebras |
| 2009/0004833 | A1 | 1/2009 | Suzuki et al. |
| 2009/0014828 | A1 | 1/2009 | Mizushima et al. |
| 2009/0092810 | A1 | 4/2009 | Lee et al. |
| 2009/0221131 | A1 | 9/2009 | Kubota et al. |
| 2009/0321829 | A1 | 12/2009 | Nguyen et al. |
| 2010/0184276 | A1 * | 7/2010 | Maboudian ..... H01L 21/823828 257/E21.133 |
| 2011/0174362 | A1 | 7/2011 | Tanner et al. |
| 2011/0298083 | A1 | 12/2011 | Yoneda |
| 2012/0009766 | A1 | 1/2012 | Adam et al. |
| 2012/0009768 | A1 * | 1/2012 | Tadatomo ............ C30B 29/403 438/479 |
| 2012/0091587 | A1 | 4/2012 | Or-Bach et al. |
| 2012/0161310 | A1 | 6/2012 | Brindle et al. |
| 2012/0217471 | A1 | 8/2012 | Shioda et al. |
| 2012/0238070 | A1 | 9/2012 | Libbert et al. |
| 2012/0267681 | A1 | 10/2012 | Nemoto et al. |
| 2012/0319121 | A1 | 12/2012 | Reynaud et al. |
| 2013/0056053 | A1 * | 3/2013 | Lochtefeld ......... H01L 31/0735 257/E31.124 |
| 2013/0120951 | A1 | 5/2013 | Zuo et al. |
| 2013/0122672 | A1 | 5/2013 | Or-Bach et al. |
| 2013/0168835 | A1 * | 7/2013 | Botula ............ H01L 21/76254 438/455 |
| 2013/0193445 | A1 | 8/2013 | Dennard et al. |
| 2013/0203214 | A1 | 8/2013 | Isobe et al. |
| 2013/0294038 | A1 | 11/2013 | Landru et al. |
| 2013/0344680 | A1 | 12/2013 | Arriagada et al. |
| 2014/0042598 | A1 | 2/2014 | Kitada et al. |
| 2014/0070215 | A1 | 3/2014 | Bedell et al. |
| 2014/0073119 | A1 * | 3/2014 | Bedell ............... H01L 21/76254 438/480 |
| 2014/0084290 | A1 * | 3/2014 | Allibert ............ H01L 21/02052 438/479 |
| 2014/0113434 | A1 | 4/2014 | Tauzin et al. |
| 2014/0120654 | A1 | 5/2014 | Fujii et al. |
| 2014/0124902 | A1 | 5/2014 | Botula et al. |
| 2014/0131800 | A1 * | 5/2014 | Botula ............. H01L 21/26513 257/347 |
| 2014/0273405 | A1 | 9/2014 | Liu et al. |
| 2015/0004778 | A1 | 1/2015 | Botula et al. |
| 2015/0115480 | A1 | 4/2015 | Peidous et al. |
| 2016/0071927 | A1 | 3/2016 | Hurwitz et al. |
| 2017/0179285 | A1 * | 6/2017 | Lochtefeld ........ H01L 29/78603 |

FOREIGN PATENT DOCUMENTS

| | | |
|---|---|---|
| EP | 2426701 A1 | 7/2012 |
| JP | 2006210596 A | 8/2006 |
| JP | 2007507093 A | 3/2007 |
| JP | 2007288165 A | 11/2007 |
| JP | 2012253364 A | 12/2012 |
| JP | 2013513234 A | 4/2013 |
| KR | 10-2012-0087188 A | 8/2012 |
| TW | 200721452 A | 6/2007 |
| WO | 20009120407 A2 | 10/2009 |
| WO | 2012127006 A1 | 9/2012 |
| WO | 2015112308 A1 | 7/2015 |
| WO | 2015119742 A1 | 8/2015 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr. Daniel C., Identification of RF harmonic distortion of Si substrates and its reduction using a trap-rich layer, EEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q.Y. et al., Semiconductor wafer bonding: recent developments, Materials Chemistry and Physics, Mar. 1994, pp. 101/127, vol. 37, No. 2, Elsevier Sequoia.

(56) References Cited

OTHER PUBLICATIONS

International Search Report and Written Opinion of the International Searching Authority regarding PCT/US2014/072546 dated Mar. 13, 2015; pp. 1-11.

* cited by examiner

HIGH RESISTIVITY SOI WAFERS AND A METHOD OF MANUFACTURING THEREOF

CROSS-REFERENCE TO RELATED APPLICATIONS

This application is a continuation application of U.S. application Ser. No. 16/948,376, which was filed Sep. 16, 2020, the disclosure of which is hereby incorporated by reference in its entirety. U.S. application Ser. No. 16/948,376 is a continuation application of U.S. application Ser. No. 16/058,550, which was filed Aug. 8, 2018 and has granted as U.S. Pat. No. 10,910,257 B2, the disclosure of which is hereby incorporated by reference in its entirety. U.S. application Ser. No. 16/058,550 is a continuation application of U.S. application Ser. No. 15/112,083, which was filed on Jul. 15, 2016 and has granted as U.S. Pat. No. 10,079,170 B2, the disclosure of which is hereby incorporated by reference in its entirety. U.S. application Ser. No. 15/112,083 is a National Stage Application of International Application No. PCT/US2014/072546, filed on Dec. 29, 2014, the disclosure of which is hereby incorporated by reference in its entirety. International Application No. PCT/US2014/072546 claims priority to U.S. Provisional Application Ser. No. 61/930,507, filed on Jan. 23, 2014, the disclosure of which is hereby incorporated by reference in its entirety.

FIELD OF THE INVENTION

The present invention generally relates to the field of semiconductor wafer manufacture. More specifically, the present invention relates to a method for forming a semiconductor-on-insulator (e.g., silicon-on-insulator) structure, and more particularly to a method for producing a handle wafer that is resistant to formation of an inversion layer in the region near the buried oxide layer, the handle wafer being useful in the manufacture of a semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between about 0.01 micrometer and about 20 micrometers thick, such as between about 0.05 micrometer and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond. After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the carrier wafer and then slowly etched away until only a thin layer of silicon on the carrier wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a carrier wafer to form a bonded wafer through a hydrophilic bonding process. Prior to bonding, the donor wafer and/or carrier wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and carrier wafer hydrophilic. The wafers are then pressed together and a bond is formed therebetween. This bond is relatively weak, and must be strengthened before further processing can occur.

In some processes, the hydrophilic bond between the donor wafer and carrier wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the carrier wafer, thus solidifying the bond between the donor wafer and the carrier wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antennae switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is at least 50 Ohm-cm, and more commonly greater than about 500 Ohm-cm. A very high resistivity semiconductor substrate, such as a silicon wafer, is prone to formation of high conductivity charge inversion or accumulation layers at the BOX/handle interface which reduce the effective resistivity of the substrate and give rise to parasitic power losses and device nonlinearity when the devices are operated at RF frequencies. See FIG. 1, which depicts a high resistivity silicon-on-insulator structure 1 comprising a P-type handle substrate 2, a buried oxide layer 4 having positive charges 6, and a silicon device layer 8. An N-type inversion layer 10 forms at the interface of the buried oxide layer 4 having positive charge 6 and the P-type handle substrate 2. These inversion/accumulation layers 10 can be due to BOX fixed charge, oxide trapped charge, interface trapped charge, and even DC bias applied to the devices themselves.

Methods have been developed to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, one of the method of creating a semiconductor-on-insulator (e.g., a silicon-on-insulator, or SOI) with a CTL for RF device applications is based on depositing an undoped polysilicon film on a silicon substrate having high resistivity and then forming a stack of oxide and top silicon layer on it. A polycrystalline silicon layer acts as a high defectivity layer between the silicon substrate and the buried oxide layer. See FIG. 2, which depicts a silicon-on-insulator structure 20 comprising high resistivity substrate 22, a buried oxide layer 24, and a silicon device layer 26. A trap rich layer 28, for example, a polycrystalline silicon film, for use as a charge trapping layer between a high resistivity substrate 22 and the buried oxide layer 24 in the silicon-on-insulator structure 20. An alternative method is the implantation of heavy ions to create a near surface damage layer. Devices, such as radiofrequency devices, are built in the top silicon layer 26.

It has been shown in academic studies that the polysilicon layer in between of the oxide and substrate improves the device isolation, decreases transmission line losses, and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghae and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008. In practice, the effectiveness of a polycrystalline silicon layer as a charge trapping layer may not be sufficient to meet the performance targets for advanced SOI RF devices. In some cases, the CTL may degrade device characteristics.

SUMMARY OF THE INVENTION

Briefly, the present invention is directed to a single crystal semiconductor handle structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane of the single crystal semiconductor handle substrate between the front and back surfaces of the single crystal semiconductor handle substrate, wherein the single crystal semiconductor handle substrate comprises a p-type dopant and has a minimum bulk resistivity of 50 Ohm-cm; an intermediate semiconductor layer having electron affinity lower than that of the single crystal semiconductor handle substrate, wherein the intermediate semiconductor layer comprises a polycrystalline, amorphous, nanocrystalline, or monocrystalline structure and comprising a material selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, a group IIIA-nitride, a metal oxide, and any combination thereof wherein x, y, and z are molar ratios with values between 0 and 1; and a semiconductor oxide layer.

The present invention is further directed to a method of preparing a single crystal semiconductor handle wafer in the manufacture of a semiconductor on insulator device, the single crystal semiconductor handle wafer comprising two major, generally parallel surfaces, one of which is the front surface of the single crystal semiconductor handle wafer and the other of which is a back surface of the single crystal semiconductor handle wafer, a circumferential edge joining the front and back surfaces of the single crystal semiconductor handle wafer, a bulk single crystal semiconductor region, and the central plane of the single crystal semiconductor handle wafer between the front and back surfaces of the single crystal semiconductor handle wafer, wherein the single crystal semiconductor handle wafer has a minimum bulk resistivity of at least 50 Ohm-cm, the method comprising: forming an intermediate semiconductor layer having electron affinity lower than that of the single crystal semiconductor handle substrate, wherein the intermediate semiconductor layer comprises a polycrystalline, amorphous, nanocrystalline, or monocrystalline structure and comprising a material selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, a group IIIA-nitride, a metal oxide, and any combination thereof wherein x, y, and z are molar ratios with values between 0 and 1; and forming a semiconductor oxide layer in interfacial contact with the intermediate semiconductor layer.

The present invention is still further directed to a method of preparing a silicon-on-insulator structure, the method comprising: bonding an exposed front surface layer of a single crystal semiconductor handle structure and an exposed oxidized front surface of a single crystal silicon donor wafer; wherein the single crystal semiconductor handle structure comprises (a) a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, and a central plane of the single crystal semiconductor handle substrate between the front and back surfaces of the single crystal semiconductor handle substrate, wherein the single crystal semiconductor handle substrate comprises a p-type dopant and has a minimum bulk resistivity of 50 Ohm-cm; (b) an intermediate semiconductor layer having electron affinity lower than that of the single crystal semiconductor handle substrate, wherein the intermediate semiconductor layer comprises a polycrystalline, amorphous, nanocrystalline, or monocrystalline structure and comprising a material selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, a group IIIA-nitride, a metal oxide, and any combination thereof wherein x, y, and z are molar ratios with values between 0 and 1; and (c) a semiconductor oxide layer; and wherein the single crystal silicon donor wafer comprises two major, generally parallel surfaces, one of which is the exposed oxidized front surface of the single crystal silicon donor wafer and the other of which is a back surface of the single crystal silicon donor wafer, a circumferential edge joining the front and back surfaces of the single crystal silicon donor wafer, and a central plane of the single crystal silicon donor wafer between the front and back surfaces of the single crystal silicon donor wafer, wherein the single crystal silicon donor wafer comprises a cleave plane.

Other objects and features of this invention will be in part apparent and in part pointed out hereinafter.

DETAILED DESCRIPTION OF THE EMBODIMENT(S) OF THE INVENTION

According to the present invention, a method is provided for designing and manufacturing semiconductor-on-insulator wafers comprising a single crystal semiconductor handle structure, a dielectric layer (commonly a buried oxide layer, or BOX), and a device layer. The single crystal semiconductor handle structure, e.g., a single crystal semiconductor handle wafer, is prepared to comprise an intermediate semiconductor layer having lower electron affinity than the handle substrate. This intermediate semiconductor layer is prepared at or near the interface of the buried oxide layer and the handle substrate. The single crystal semiconductor handle structure comprising the intermediate semiconductor layer of low electron affinity is useful in the production of a semiconductor-on-insulator (e.g., silicon-on-insulator) structure. According to the present invention, the intermediate semiconductor layer of low electron affinity in the single crystal semiconductor handle structure, e.g., a wafer, is formed at the region at or near the interface between the buried oxide layer and the handle substrate. Advantageously, the method of the present invention provides a intermediate semiconductor layer of low electron affinity effective for improving immunity against charge inversion in the region of the structure at the interface between the buried oxide layer and the handle substrate.

Figure 1:
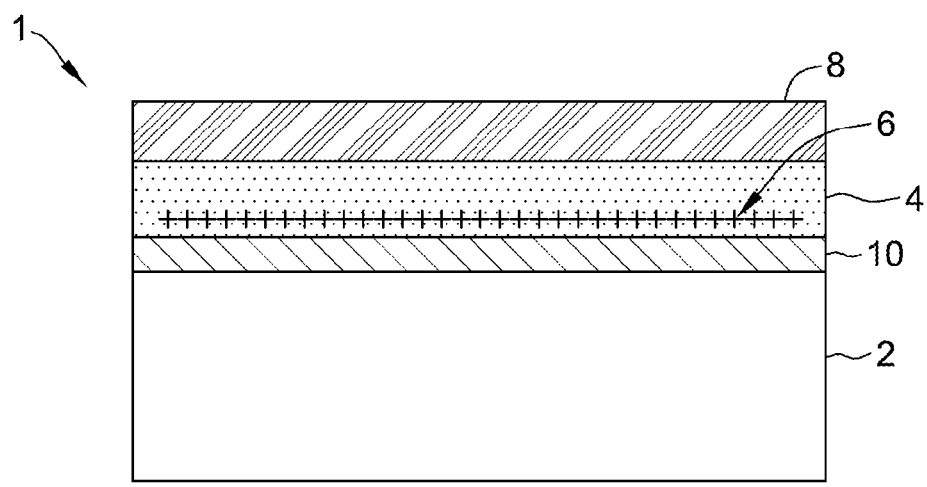
FIG. 1 is a depiction of a silicon-on-insulator wafer according to the prior art in which an N-type inversion layer has formed at the interface of a buried oxide layer and a P-type handle substrate.
Figure 2:
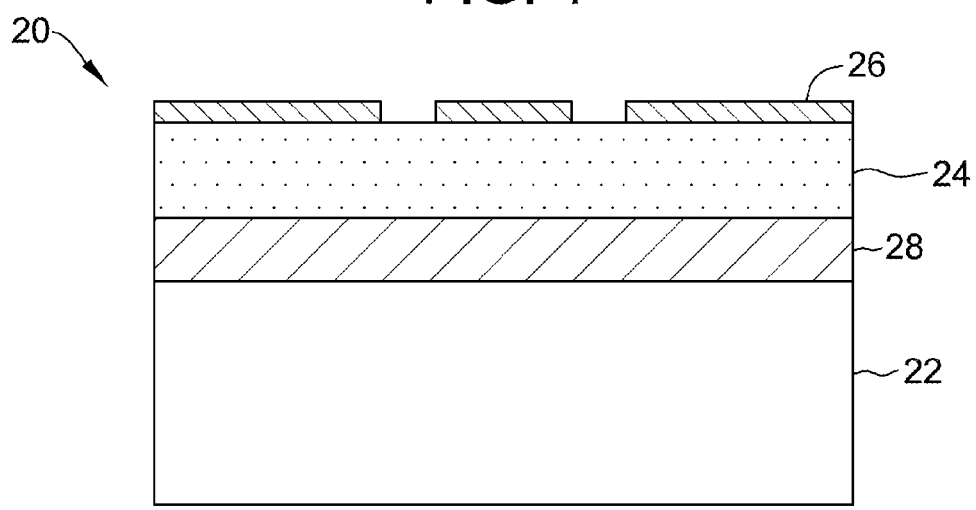
FIG. 2 is a depiction of a silicon-on-insulator wafer according to the prior art comprising a trap rich layer between a high resistivity substrate and a buried oxide layer.

A key factor leading to degradation of high resistivity semiconductor-on-insulator (HR-SOI, e.g., a high resistivity silicon-on-insulator) RF device performance is N-type inversion layers on the surface of SOI P-type handle structures at the interface with the buried oxide layer (BOX). An inversion layer is induced to neutralize the positive charge in the BOX that is typically inevitable for oxides on silicon and other semiconductors. See FIG. 1, which is a depiction of a conventional silicon-on-insulator wafer 1 in which an N-type inversion layer 10 has formed at the interface of a buried oxide layer 4 and a P-type handle substrate 2. The present invention provides a method of manufacturing a high resistivity semiconductor-on-insulator structure, e.g., a high resistivity silicon-on-insulator structure, for use in an RF device, prepared with an improved immunity against inversion of a region of the handle substrates at or near the interface with the buried oxide layer. The HR-SOI structure of the present invention is prepared with a handle structure that comprises an intermediate semiconductor layer in between of the handle substrate and BOX. The intermediate semiconductor layer is made of a semiconductor material with an electron affinity lower than that of the handle substrate (electron affinity is the energy required to release an electron from the bottom of conduction band to the vacuum level). See FIG. 3, which is a depiction of a silicon-on-insulator structure 30 comprising a handle substrate 32, a buried oxide layer 34 comprising positive charge 36, and a silicon device layer 38, according to the present invention in which no N-type inversion layer is formed at the interface of the buried oxide layer and the handle substrate. Instead, the silicon-on-insulator structure 30 comprises an uninverted intermediate semiconductor layer 40 of lower electron affinity than the handle substrate. This intermediate semiconductor layer 40 of lower electron affinity than the handle substrate is capable of inhibiting the formation of the N-type inversion layer.

Figure 4:
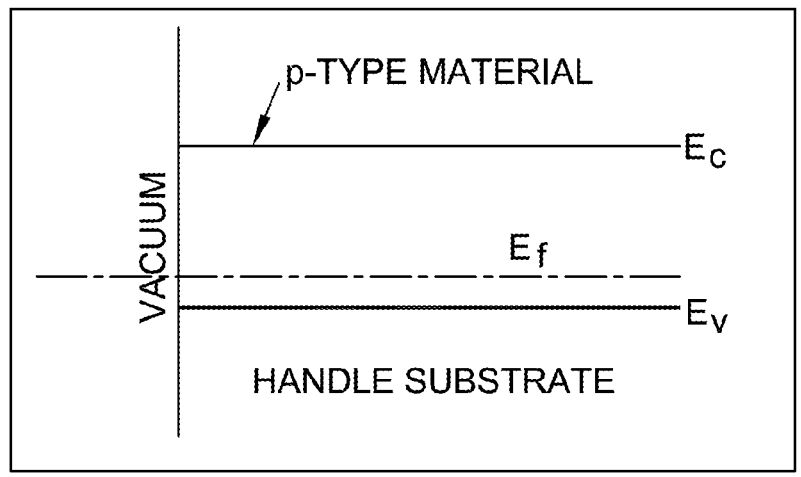
FIG. 4 is a graph depicting the energy-band diagram of a handle wafer according to the prior art before BOX formation.
Figure 5:
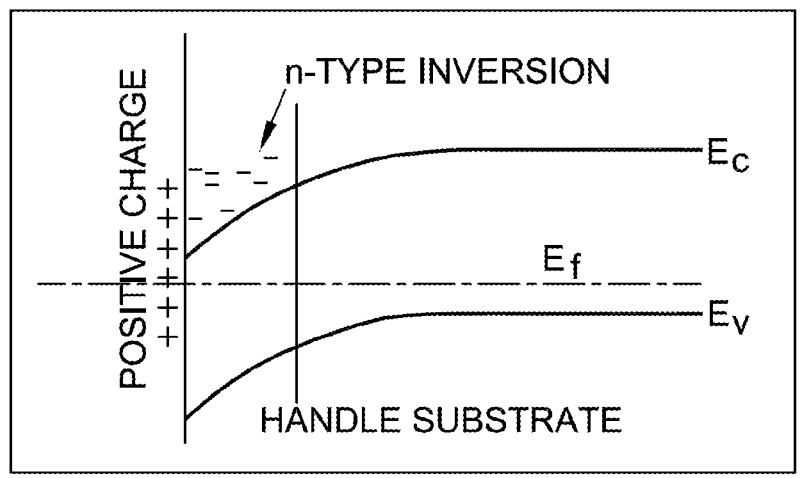
FIG. 5 is a graph depicting the energy-band diagram of a handle wafer according to the prior art after BOX formation.

The reason for the formation of an N-type inversion layer in a conventional P-type handle substrate is illustrated by the energy-band diagrams provided in FIGS. 4 and 5. FIG. 4 is a graph depicting the energy-band diagram of a typical P-type handle wafer prior to formation of the BOX, while FIG. 5 is a graph depicting the energy-band diagram of a handle wafer according to the prior art after BOX formation. As depicted in FIG. 4, the conduction band and valence band are typical of a conventional P-type silicon wafer in a vacuum. After deposition of a silicon oxide layer, the positive charge, which is generally inherently present, therein needs to be neutralized by negative charge. Therefore, any electron carriers (negatively charged) in the substrate will be attracted to the BOX interface and will accumulate there. Accordingly, the interface layer of the substrate will be filled with electrons as opposed to the bulk portion on the P-type substrate. As depicted in FIG. 5, the positive charge in BOX causes the bending of the valence band and conduction band of the silicon at the surface with the BOX. Accordingly, negative charges of mobile minority carriers—electrons—emerge at the surface. They form an interface conductive layer that is called an inversion layer.

Figure 6:
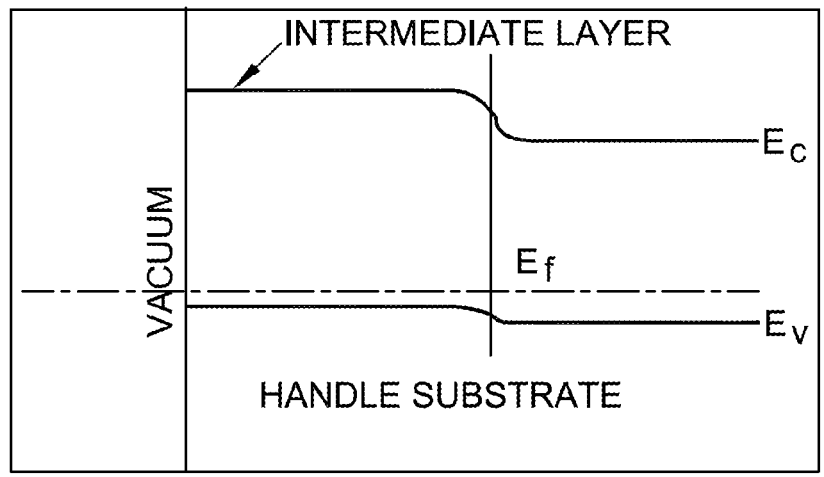
FIG. 6 is a graph depicting the energy-band diagram of a handle wafer according to the present invention before BOX formation.
Figure 7:
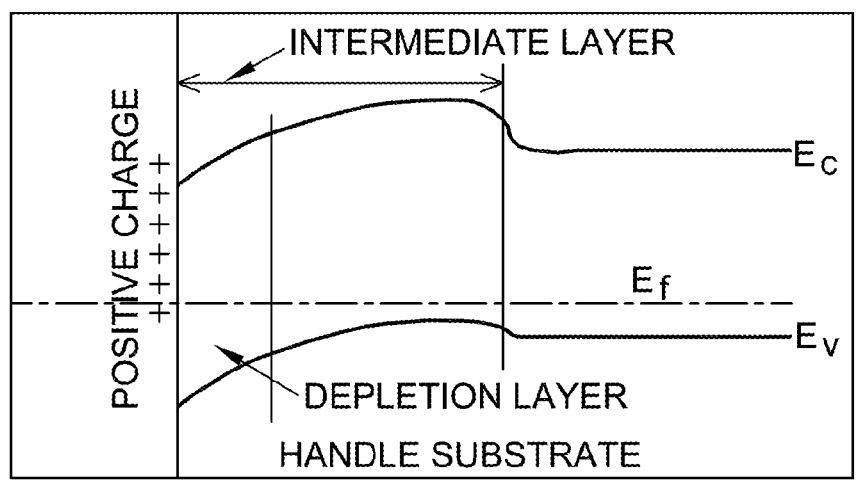
FIG. 7 is a graph depicting the energy-band diagram of a handle wafer according to the present invention after BOX formation.

According to the method of the present invention, a single crystal semiconductor handle structure is formed with an intermediate semiconductor layer at or near the interface of the buried oxide layer and the handle substrate. The intermediate semiconductor layer has lower electron affinity than the handle substrate. The intermediate semiconductor layer improves the handle structure's ability to resist formation of an N-type inversion layer near the BOX interface. The intermediate semiconductor layer is engineered to have higher electron energy than the handle substrate, which is typically a P-type substrate. By forming a higher electron energy semiconductor layer at or near the interface of the handle substrate and the BOX, the attraction of electrons, that is, mobile negative charge, from the high resistivity substrate to the BOX interface is decreased. Stated another way, the positive charge in the BOX will be neutralized by essentially immobile (or much less mobile) negatively charged ions in the intermediate semiconductor layer. For example, if the intermediate semiconductor layer comprises a SiGe layer, the immobile charge neutralized atoms comprise $Si^-$ or $Ge^-$ ions in the SiGe crystal network. The mechanism of the inversion inhibiting effect of the semiconductor layer in the handle substrate of the present invention is illustrated in FIGS. 6 and 7. FIG. 6 is a graph depicting the energy-band diagram of a handle wafer according to the present invention before BOX formation, which depicts the enhanced P-type nature of the intermediate semiconductor layer, as shown by the relative positions of the conduction band and the valence band compared to the Fermi level. FIG. 7 is a graph depicting the energy-band diagram of a handle wafer according to the present invention after BOX formation. The intermediate semiconductor layer alters the valence band and conduction band such that, even after BOX formation, these bands effectively retain their P-type character, even in the near BOX depletion layer ($E_c$-$E_f$>$E_f$-$E_v$).

Figure 3:
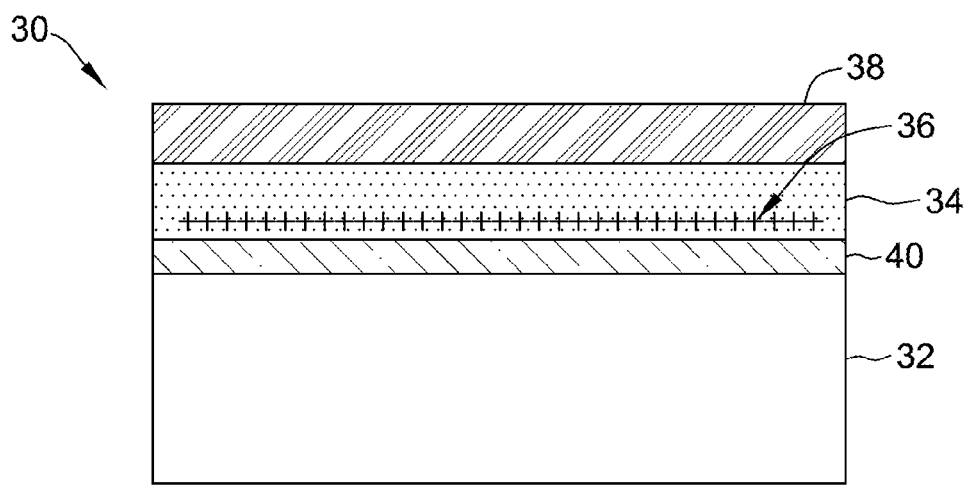
FIG. 3 is a depiction of a silicon-on-insulator wafer according to the present invention in which no N-type inversion layer is formed at the interface of the buried oxide layer and the handle substrate.

With reference to FIG. 3, the substrate for use in the present invention is a single crystal semiconductor handle substrate 32, e.g., a single crystal semiconductor handle wafer. In general, the single crystal semiconductor handle substrate 32 comprises two major, generally parallel surfaces. One of the parallel surfaces is a front surface of the substrate 32, and the other parallel surface is a back surface of the substrate 32. The substrate 32 comprises a circumferential edge joining the front and back surfaces, and a central plane between the front and back surfaces. The substrate 32 additionally comprises an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces. According to the method of the present invention, in the manufacture of semiconductor-on-insulator structures 30, the device layer 38 is generally derived from a single crystal semiconductor donor substrate (not picture). In some embodiments, the donor substrate may be substantially identical to the handle substrate 32 prior to any of the operations described herein, i.e., comprise the same material and have the same general dimensions. In some embodiments, the handle substrate 32 and the donor substrate may comprise a different material, e.g., in the formation of a sapphire-on-insulator structure.

Prior to any operation as described herein, the front surface and the back surface of the handle substrate 32 (and a donor substrate) may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate 32, e.g., a single crystal silicon handle wafer, refers to the major surface of the substrate that becomes an interior surface of the bonded structure 30. According to the method of the present invention, the intermediate semiconductor layer 40 is prepared on the front surface of the single crystal semiconductor handle substrate 32. Accordingly, a "back surface" of a single crystal semiconductor handle substrate 32, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. The front surface of the donor substrate may comprise a dielectric layer, e.g., an oxide layer, which becomes an interior dielectric layer 34 in the final semiconductor-on-insulator structure 30.

The single crystal semiconductor handle substrate and the single crystal semiconductor donor substrate may be single crystal semiconductor wafers. In preferred embodiments, the semiconductor wafers comprise a semiconductor material selected from the group consisting of silicon, silicon carbide, sapphire, aluminum nitride, silicon germanium, gallium arsenide, gallium nitride, indium phosphide, indium gallium arsenide, germanium, and combinations thereof. The handle substrate 32 and the device layer 38 may comprise the same semiconductor material, or they may be different. In view thereof, SOI structures 30 may comprise, e.g., silicon-on-insulator, sapphire-on-insulator, aluminum nitride-on-insulator, and other combinations. The single crystal semiconductor wafers, e.g., the single crystal silicon handle wafer and single crystal silicon donor wafer, of the present invention typically have a nominal diameter of at least about 150 mm, at least about 200 mm, at least about 250 mm, at least about 300 mm, at least about 400 mm, at least about 450 mm, or more. Wafer thicknesses may vary from about 250 micrometers to about 1500 micrometers, suitably within the range of about 500 micrometers to about 1000 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solutions. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 250 mm, at least about 300 mm, at least about 400 mm, at least about 450 mm, or more. Preferably, both the single crystal silicone handle wafer and the single crystal silicone donor wafer have mirror-polished front surface finishes that are free from surface defects, such as scratches, large particles, etc. Wafer thickness may vary from about 250 micrometers to about 1500 micrometers, suitably within the range of about 500 micrometers to about 1000 micrometers. In some specific embodiments, the wafer thickness may be about 725 micrometers.

In some embodiments, the single crystal semiconductor wafers, i.e., handle wafer and donor wafer, comprise interstitial oxygen in concentrations that are generally achieved by the Czochralski-growth method. In some embodiments, the semiconductor wafers comprise oxygen in a concentration between about 1 PPMA and about 30 PPMA, such as between about 4 PPMA and about 18 PPMA. In some embodiments, the semiconductor wafers comprise oxygen in a concentration between about 10 PPMA and about 35 PPMA. Interstitial oxygen may be measured according to SEMI MF 1188-1105.

In some embodiments, the semiconductor handle substrate, e.g., a single crystal semiconductor handle substrate, such as a single crystal silicon handle wafer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 50 Ohm-cm, such as between about 50 Ohm-cm and about 100,000 Ohm-cm, between about 100 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, or between about 3000 Ohm cm and about 5,000 Ohm-cm. In some embodiments, the single crystal semiconductor handle wafer has a minimum bulk resistivity between about 750 Ohm-cm and about 5,000 Ohm-cm.

In preferred embodiments, the high resistivity single crystal semiconductor handle wafer comprises a P-type dopant, typically boron. In general, the concentration of the P-type dopant is on the order of $1\times10^{14}/cm^3$ or less, such as $1\times10^{13}/cm^3$ or less, or $1\times10^{12}/cm^3$ or less. In some embodiments, the concentration of the P-type dopant may be between about $1\times10^{12}/cm^3$ and about $1\times10^{13}/cm^3$. Methods for preparing high resistivity wafers are known in the art, and such high resistivity wafers may be obtained from commercial suppliers, such as SunEdison, Inc. (St. Peters, Mo.; formerly MEMC Electronic Materials, Inc.).

According to the method of the present invention, semiconductor material is deposited as an intermediate semiconductor layer onto the exposed front surface of the single crystal semiconductor handle substrate, e.g., a single crystal silicon handle wafer. In some embodiments, the front surface of the single crystal semiconductor handle substrate comprises an exposed oxidized front surface layer. The intermediate semiconductor layer may comprise a polycrystalline structure, an amorphous structure, a nanocrystalline structure, or a monocrystalline structure. Monocrystalline materials are typically deposited by processes that cause the semiconductor material to retain the crystal structure of the underlying substrate, such as epitaxial deposition. A nanocrystalline material includes a material with very small grain sizes of the order of less than about 100 nm. To describe a structure as nanocrystalline refers to a transitional structure from polycrystalline to amorphous. A polycrystalline material denotes a material comprising small crystals having random crystal orientations. Polycrystalline material grains may be as small in size as about 20 nanometers. Amorphous materials lack short range and long range order. In some instance, the material may comprise grains having crystallinity of no more than about 10 nanometers while still be considered essentially amorphous.

The intermediate semiconductor layer formed at or near the interface of the BOX and the handle substrate comprises a material of lower electron affinity relative to the single crystal semiconductor handle substrate. Exemplary materials of lower electron affinity than the single crystal semiconductor handle substrate, typically a single crystal silicon handle substrate, include silicon doped with one of germanium, carbon, tin, and combinations thereof, or germanium doped with tin. For example, the material may be selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, and any combination thereof. In these chemical formulas, x, y, and z are molar ratios varying in value from 0 to 1, such that the material is a compound semiconductor. In some embodiments, $0<x<1$, and preferably, $0.01<x<0.99$, or $0.1<x<0.9$, or $0.2<x<0.7$. In other embodiments, $0<x+y<1$, and preferably $0.01<x+y<0.99$, or $0.1<x+y<0.9$, or $0.2<x+y<0.7$. In still other embodiments, $0<x+y+z<1$, and preferably $0.01<x+y+z<0.99$, or $0.1<x+y+z<0.9$, or $0.2<x+y+z<0.7$. In some embodiments, the values of x, y, and z vary between 0.01 and 0.99, such as between about 0.05 and about 0.95, or between about 0.1 and about 0.9. Preferably, the values for x, y, and z may be between about 0.2 and about 0.7. Additional semiconductor materials include group IIIA-nitrides and semiconductor oxides. In some embodiments, the group IIIA-nitrides may include GaN, AlN, InN, BN, and $Al_{1-x-y-z}Ga_xIn_yB_zN$ with $0<x+y+z<1$, more preferably $0.01<x+y+z<0.99$, or between $0.1<x+y+z<0.9$. In some embodiments, the values of x, y, and z may be between about 0.2 and about 0.7. Semiconductor oxides include $SnO_2$, $TiO_2$, ZnO.

The material for deposition onto the front surface of the single crystal semiconductor handle substrate, e.g., an optionally oxidized front surface of a single crystal silicon wafer, may be deposited by means known in the art. The formation of the layer can be accomplished with chemical vapor phase deposition (CVD), metalorganic CVD, molecular beam epitaxy (MBE), plasma enhanced CVD, atomic layer deposition, physical vapor deposition, pulsed laser deposition, implantation in Si, or layer transfer. In some embodiments, the semiconductor material may be deposited using low pressure chemical vapor deposition (LPCVD), plasma enhanced chemical vapor deposition (PECVD), or physical vapor deposition (PVD). For example, polycrystalline silicon doped with germanium, carbon, tin, and combinations thereof may be deposited by chemical vapor deposition. In some embodiments, silicon deposition may occur in a CVD reactor using dichlorosilane as the precursors for the Si. Alternative silicon precursors may include, but are not limited to, silane, disilane, trichlorosilane, trisilane, pentasilane, neopentasilane or other higher order precursors. In some embodiments, silicon may be deposited onto the surface oxidation layer by pyrolyzing a silicon precursor, such as silane ($SiH_4$), in a temperature range between about 350° C. and about 950° C., or between about 450° C. and about 950° C., or between about 550° C. and about 690° C., such as between about 580° C. and about 650° C. The chamber pressure may range from about 70 to about 400 mTorr. For some deposition processes, the pressure may range from about 0.5 to about 750 Torr, such as between about 1 and about 750 Torr, or between about 1 and about 60 Torr. The semiconductor layer deposition rate may range from 10-500 nm/min, preferably 20-100 nm/min. Silicon may be doped with germanium by including a germanium compound in the dopant gas, such as organogermanium compounds, such as germane, digermane, isobutylgermane, alkylgermanium trichlorides, and dimethylaminogermanium trichloride. Additionally, custom precursors such as germlysilane or silylgermane could be used for the deposition of the SiGe layer. Organometallic Tin compounds, such as Tin chloride, and Tin hydride precursors are typically used for Tin containing compound deposition. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane.

Silicon doped with C, Ge, or Sn may be deposited in a manner such that the concentration of the dopant C, Ge, or Sn changes, and generally gradually increases, in the direction of deposition from the single crystal semiconductor handle substrate. The concentration may vary according to a linear gradient, a parabolic gradient, or may be varied in a stepwise manner. For example, in a process in which the Ge content is increased in a stepwise fashion, a first layer of 50 nm thick $Si_{1-x}Ge_x$ with x=0.2 is deposited followed by a second $Si_{1-x}Ge_x$ layer of 30 nm with x=0.4. Then a third layer of 30 nm thick $Si_{1-x}Ge_x$ with x=0.6 is deposited. The additional benefit of the graded $Si_{1-x}Ge_x$ layer structure is that an electric field is built up in the $Si_{1-x}Ge_x$ layer stack that pushes the electrons away from the layer surface. Yet another method to achieve this graded Ge profile is to linearly or parabolically grade the Ge composition from a starting Ge concentration at the handle substrate surface up to a final Ge concentration that is higher than the starting Ge concentration over a specified thickness. For example, the deposition of $Si_{1-x}Ge_x$ may begin with suitable precursors in suitable molar ratios such that x=0.2, i.e., the initial deposition is of $Si_{0.8}Ge_{0.2}$, and the germanium precursor concentration may be gradually increased until an intermediate layer having thickness between about 0.3 micrometers and about 5 micrometers is formed in which the final semiconductor material comprises $Si_{0.4}Ge_{0.6}$. Many other variations are possible while still falling within the scope of the present invention.

Amorphous silicon may be deposited from silicon precursors, such as silane, disilane, dichlorosilane, trichlorosilane, trisilane, pentasilane, neopentasilane or other higher order precursors by plasma enhanced chemical vapor deposition (PECVD) at temperatures generally ranging between about 75° C. and about 300° C.

Germanium layers, which may optionally be doped with tin, may be deposited at temperatures up to about 300° C. by chemical vapor deposition by including organogermanium compounds, such as germane, digermane, isobutylgermane, alkylgermanium trichlorides, and dimethylaminogermanium trichloride. Epitaxial deposition is suitable for depositing a semiconductor layer that essentially retains the monocrystalline structure of the underlying handle substrate. However, depending on deposition conditions, a semiconductor layer deposited using epitaxial reactor may be deposited as polycrystalline or amorphous. Finally, it is also possible to deposit an epitaxial semiconductor layer and subject the epitaxially deposited semiconductor layer to further processing to thereby convert it to highly defective structure, similar in properties to polycrystalline material.

In the context of the present invention, Group IIIA refers to the boron group of elements, including boron, aluminum, gallium, indium. Accordingly, Group IIIA-nitrides include boron nitride, aluminum nitride, gallium nitride, and indium nitride. The Group IIIA-nitride layer may be deposited using metalorganic chemical vapor deposition (MOCVD), metalorganic vapor phase epitaxy (MOVPE), or molecular beam epitaxy (MBE). In some preferred embodiments, the Group IIIA nitride layer may be deposited using metalorganic chemical vapor deposition (MOCVD). A suitable MOCVD reactor may be a Veeco TurboDisc or an Aixtron G5. In MOCVD, metalorganic compounds are used as the precursors. Aluminum precursors suitable for MOCVD include trimethylaluminum and triethylaluminum. Gallium precursors for MOCVD include trimethylgallium and triethylgallium. Indium precursors suitable for MOCVD include trimethylindium, triethylindium, di-isopropylmethylindium, and ethyldimethylindium. Nitrogen precursors suitable for MOCVD include Ammonium, phenyl hydrazine, dimethyl hydrazine, tertiary butyl amine, and ammonia. Boron precursors include diborane, boron chloride, 1,3,5-tri(N-methyl)borazine. The molar ratio of Group V precursor (e.g., ammonia) to Group IIIA precursor (e.g., trimethyl gallium) may be between 0.1 to 10000, such as between 1 and 10000, preferably between 100 to 1000. The deposition temperature ranges from 700° C. to 1200° C., depending on the composition of the alloy. In-containing nitrides require a deposition temperature towards the lower end, between 700 and 800° C. The Group IIIA nitride may be formed under reduced pressure, such as between about 10 Torr to about 760 Torr (about 101 kPa), preferably between about 10 Torr (about 1.33 kPa) and about 80 Torr (about 10.67 kPa). Al-rich nitrides prefers a deposition pressure on the low side, 10-80 Torr. Nitrogen, hydrogen or the mixture of nitrogen and hydrogen can be used as the carrier gas. Nitrogen carrier gas is preferred when In-containing nitride is deposited. The thickness of the nitride alloys ranges from 0.01 to 1 μm, preferably from 0.1 to 0.5 μm. In MBE, either metalorganic precursors or solid sources of Ga, In, Al, B can be used. $N_2$ or $NH_3$ can be used to as the nitride precursor. Plasma can be used to crack the precursors and lower the growth temperatures. Deposition temperature ranges from 400° C.

to 900° C., preferably between 600° C. and 800° C. MBE operates in ultrahigh vacuum ($10^{-10}$-$10^{-8}$ Torr). The thickness of the nitride alloys ranges from 0.01 to 1 μm, preferably from 0.1 to 0.5 μm.

Deposition of $SnO_2$, $TiO_2$ and $ZnO_2$ is carried out in a chemical vapor phase deposition chamber. The typical Tin metalorganic precursors include but not limited to tetramethyltin, trimethyltinchloride. The typical Titanium metalorganic precursors include but not limited to methyltitaniumchloride and titaniumchloride; the typical Zn metalorganic precursors include but not limited to Dimethylzinc and Diethylzinc. Oxygen, Ozone, or water is used as the oxygen source. Deposition is carried out from 400° C. to 600° C. with reactor pressure ranging between about 10 Torr to about 760 Torr (about 101 kPa), preferably between about 10 Torr (about 1.33 kPa) and about 80 Torr (about 10.67 kPa).

According to some embodiments, the intermediate semiconductor layer formed on the front surface layer of the single crystal semiconductor handle wafer may be deposited as a strained semiconductor layer. In general, an epitaxially deposited layer essentially retains the crystalline form of the underlying substrate, which may be (100), (110), or (111). In instances wherein the lattice constants of the semiconductor layer and the substrate are different, the epitaxial layer becomes strained to accommodate the difference, as is often the case for SiGe and Si:C materials grown on top of silicon. In some embodiments, it may be desirable to retain the strained character of the deposited intermediate semiconductor layer. In some embodiments, however, the method of the present invention further includes partially relaxing or fully relaxing the semiconductor layer. During post-epitaxial wafer processing, such as high-temperature anneals, due to high strain, the stress-induced defects, such as dislocations, may generate and multiply in the epitaxial layer. The development of such defective structures reduces in internal stresses in the layer and relaxes the strained layer. This relaxation may be partial or may fully relax the semiconductor layer. It may be possible during epitaxial deposition that the epi layer reaches a critical thickness in which relaxation may occur. In some embodiments, the strained epi layer may become fully relaxed due to the developed defective structure. Typically, the higher the temperature and longer the duration of post-epi thermal treatments, the higher the probability for the full relaxation. As an example, a $Si_{0.5}Ge_{0.5}$ layer grown by epitaxial deposition on a silicon handle structure will be essentially relaxed during 1 hour anneals at temperatures greater than 1000° C.

The layer thickness of the intermediate semiconductor layer is determined experimentally such that it is sufficient to meet the device requirements but not extended too much as the latter increases the manufacturing cost. The overall thickness of the intermediate semiconductor layer may be between about 0.3 micrometers and about 5 micrometers, such as between about 0.3 micrometers and about 3 micrometers, such as between about 0.3 micrometers and about 2 micrometers or between about 2 micrometers and about 3 micrometers.

According to the present invention, the role of the intermediate semiconductor layer of lower electron affinity than the handle substrate is not necessarily charge trapping. However, this intermediate semiconductor layer may also trap charges, which brings with it that extra benefit in RF performance. In some embodiments, the method of the present invention may be used in combination with conventional charge trapping layers. In some embodiments, the CTL may be placed under the BOX, i.e., the charge trapping layer is between the intermediate semiconductor layer and the dielectric layer. In some embodiments, the CTL may be under the intermediate semiconductor layer of the present invention, i.e., the charge trapping layer is between the intermediate semiconductor layer and the handle substrate.

The intermediate semiconductor layer may be further treated by conventional methods of semiconductor processing to modify its properties in a desired way. For example, a SiGe layer may be implanted with boron that stabilizes the SiGe crystal structure during high temperature treatments. An implantation with heavy ions such as Argon may be used to amorphize the semiconductor layer adding charge trapping ability. Plasma or wet chemical etching on top of the semiconductor layer may improve its bonding properties essential for high quality SOI fabrication. An epitaxial growth may yield the semiconductor layer to have rough surface. In some embodiments, therefore, chemical mechanical polishing may be required for ensure the surface smoothness during SOI bonding.

After deposition of the intermediate semiconductor layer, an oxide film is formed on top of the deposited semiconductor material film. This may be accomplished by means known in the art, such as thermal oxidation (in which some portion of the deposited semiconductor material film will be consumed) and/or CVD oxide deposition. The oxide can be a chemical oxide, thermal oxide or deposited oxide. A preferred oxide thickness can be in the range of 5 Å-10000 Å, but more preferably in the range of 5 Å-50 Å. As previously mentioned, an oxide film, e.g., silicon oxide, generally, in many cases inherently, comprises a net positive charge. The positive charge in the semiconductor layer results from several oxide charges. The charges include interface-trapped charge $Q_{it}$, which is due to the interfacial properties between the buried oxide, e.g., silicon oxide, and the single crystal semiconductor handle material, e.g., single crystal silicon. This charge is dependent on the chemical composition of the interface. The interface trap charge density is orientation dependent. For example, the positive charge density in the near surface region of a single crystal silicon handle substrate having <100> crystal orientation is about an order of magnitude smaller than the charge density in silicon having <111> crystal orientation. After a 450° C. hydrogen anneal, the interface-trapped charge <100> crystal orientation silicon may be as low as $10^{10}/cm^2$. An additional source of positive charge is the fixed-oxide charge, $Q_f$, which is the charge that most affects HR-SOI performance. The fixed-oxide charge is located within approximately 3 nm from the $SiO_2$-Si interface. This charge is fixed and cannot be charged or discharged over a wide variation of surface potential. Generally, $Q_f$ is positive and depends on oxidation and annealing conditions and on silicon orientation. It has been suggested that when the oxidation is stopped, some ionic silicon is left near the interface, which may result in the positive interface charge $Q_f$. Typical fixed-oxide charge densities for a carefully treated $SiO_2$-Si interface system are about $10^{10}/cm^2$ for a <100> crystal orientation surface and about $5\times10^{10}/cm^2$ for a <111> crystal orientation surface. Another source of positive charge comprises oxide-trapped charge $Q_{ot}$. Oxide-trapped charges are associated with defects in the silicon dioxide. These charges can be created, for example, by X-ray radiation or high-energy electron bombardment the trap are distributed inside the oxide layer. Most of process-related oxide trapped charge can be removed by low-temperature annealing. Finally, the positive oxide charges may comprise mobile ionic charges, $Q_m$. The mobile ionic charges $Q_m$ such as sodium or other alkali ion are positive and mobile within the oxide under raised temperature (e.g. >100° C.) and high electric field operation. These sources of positive charge in the buried oxide layer are associated with HR-SOI device degradation due to the formation of the N-type inversion layer, as previously described. The intermediate semiconductor layer of the present invention comprising low electron affinity material enables the P-type handle substrate to retain its P-type character even in the interface region near the BOX.

After oxidation, wafer cleaning is optional. If desired, the wafers can be cleaned, for example, in a standard SC1/SC2 solution. Additionally, the wafers may be subjected to chemical mechanical polishing (CMP) to reduce the surface roughness, preferably to the level of $RMS_{2\times 2\ um2}$ is less than about 5 angstroms, wherein root mean squared—

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point.

The single crystal semiconductor handle wafer prepared according to the method described herein to comprise a single crystal semiconductor handle substrate, an intermediate semiconductor layer of lower electron affinity than the handle substrate, and an oxide layer is next bonded a single crystal semiconductor donor substrate, e.g., a single crystal semiconductor donor wafer, which is prepared according to conventional layer transfer methods. That is, the single crystal semiconductor donor wafer may be subjected to standard process steps including oxidation, implant, and post implant cleaning. Accordingly, a single crystal semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate. Ion implantation may be carried out in a commercially available instrument, such as an Applied Materials Quantum II. Implanted ions include He, H, Hz, or combinations thereof. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans. In some embodiments of the present invention, the single crystal semiconductor donor substrate having a damage layer therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hour, preferably a duration of about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the cleaned single crystal semiconductor donor substrate having the thermally activated cleave plane therein is subjected to oxygen plasma and/or nitrogen plasma surface activation. In some embodiments, the oxygen plasma surface activation tool is a commercially available tool, such as those available from EV Group, such as EVG® 810LT Low Temp Plasma Activation System. The single crystal semiconductor donor wafer having the thermally activated cleave plane is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above to have a nanocavity layer and preferably a silicon oxide layer.

The hydrophilic front surface layer of the single crystal semiconductor donor substrate and the oxidized front surface of the single crystal semiconductor handle substrate having the nanocavity layer are next brought into intimate contact to thereby form a bonded structure. Since the mechanical bond is relatively weak, the bonded structure is further annealed to solidify the bond between the donor wafer and the carrier wafer. The bonded structure may be annealed at a temperature up to about 1200° C., such as between about 1000° C. and about 1200° C., preferably at a temperature of about 1125° C. The thermal anneal may have a duration between about 30 minutes hours and about 8 hours, preferably for about 4 hours.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart.

After the high temperature anneal and cleave, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using $H_2$ as a carrier gas. In some embodiments, an epitaxial layer may be deposited on the transferred device layer. The finished SOI wafer may then be subjected to end of line metrology inspections and cleaned a final time using typical SC1-SC2 process.

According to the present invention and with reference to FIG. 3, a semiconductor-on-insulator structure 30 is obtained with an intermediate semiconductor layer 40 embedded underneath a dielectric layer 34 (e.g., a BOX) and in contact with the handle substrate 32. The intermediate semiconductor layer 40 comprises a semiconductor material having lower electron affinity than the single crystal semiconductor handle substrate 32. The intermediate semiconductor layer 40 in a semiconductor-on-insulator structure 30 under the dielectric layer 34 can be effective for resisting formation of an N-type inversion layer in the region near the BOX, thereby preserving the P-type electrical character of the high resistivity substrate 32.

Having described the invention in detail, it will be apparent that modifications and variations are possible without departing from the scope of the invention defined in the appended claims.

The following non-limiting examples further illustrate the present invention.

Example 1

200 mm single side polished single crystal silicon wafers with resistivity >750 Ohm-cm (SunEdison, Inc.; St. Peters, Mo.) are coated with SiGe. A layer of $Si_{1-x}Ge_x$ is epitaxially deposited on the HR-Si handle substrate. The composition of Ge ranges from 0 to 100%. The thickness of the $Si_{1-x}Ge_x$ layer is from 10-2000 nm, preferably 50-500 nm. The deposition is carried out in a CVD reactor using dichlorosilane and germane as the precursors for the Si and Ge respectively. The deposition temperature ranges from 450° C. to 950° C. at a pressure of 1-750 Torr, preferably 1-60 Torr. A deposition rate of 10-500 nm/min, preferably 20-100 nm/min, is used. The resulting surface roughness (measured with AFM Rms) is ideally from 1 Å-10 Å and CMP can be used to planarize the surface if a higher surface roughness is obtained after the epitaxial deposition. The threading dislocation density ranges from 0 to $10^{10}$ $cm^{-2}$. Both the threading dislocations and the misfit dislocations have dangling bonds that act as carrier traps. Additional traps can be created by deep level metal gettering due to the strain field associated with the dislocations.

Example 2

200 mm single side polished single crystal silicon wafers with resistivity >750 Ohm-cm (SunEdison, Inc.; St. Peters, Mo.) are coated with SiGe. The $Si_{1-x}Ge_x$ layer consists of a series of Ge-concentrated graded layers epitaxially grown on the HR-Si handle substrates. The Ge concentration gradually increases from the beginning of deposition to the end of deposition by changing the gas phase concentration of dichlorosilane and germane in the CVD chamber. This graded Ge profile is to linearly grade the Ge composition from a starting Ge concentration at the handle substrate surface up to a final Ge concentration that is higher than the starting Ge concentration over a specified thickness. CMP process may be required to achieve Rms<5 Å.

Example 3

200 mm single side polished single crystal silicon wafers with resistivity >750 Ohm-cm (SunEdison, Inc.; St. Peters, Mo.) are coated with SiGe. The $Si_{1-x}Ge_x$ layer consists of a series of Ge-concentrated graded layers epitaxially grown on the HR-Si handle substrates. The Ge concentration is changed in a stepped way. A first layer of 50 nm thick $Si_{1-x}Ge_x$ with x=0.2 is deposited followed by a second $Si_{1-x}Ge_x$ layer of 30 nm with x=0.4. Then a third layer of 30 nm thick $Si_{1-x}Ge_x$ with x=0.6 is deposited. CMP process may be required to achieve Rms<5 Å.

Example 4

200 mm single side polished single crystal silicon wafers with resistivity >750 Ohm-cm (SunEdison, Inc.; St. Peters, Mo.) are coated with amorphous Si. An example of the formation of a charge trap layer by the deposition of an amorphous Si (alternatively, α-Si:C, α-SiGe, α-Ge etc) layer is described herewithin. On top of the handle substrate, an amorphous silicon layer is directly deposited inside a CVD chamber. The deposition is carried out using silicon precursors that include, but not limited to, trisilane, silane, disilane, dichlorosilane, neopentasilane, or other higher order precursors. The deposition temperature is preferably in the range of 350° C.-550° C. at a pressure in the range of 0.5 Torr-750 Torr. In the case of an amorphous alloy of Si, the appropriate alloy precursor gas can be added to the reactor chamber in addition to the silicon precursor gas (e.g. germane or digermane for an α-SiGe layer, methylsilane for an α-Si:C layer, etc). An alternate approach to forming the amorphous layer on top of the handle substrate is to insert a thin oxide between the handle and the amorphous layer. The oxide can be a chemical oxide, thermal oxide or deposited oxide. A preferred oxide thickness can be in the range of 5 Å-10000 Å, but more preferably in the range of 5 Å-50 Å. The insertion of the thin oxide layer between the amorphous layer and the handle substrate will minimize the amount of recrystallization of the amorphous layer during subsequent thermal cycles. The final amorphous layer should have an RMS roughness in the range of 1 Å-10 Å. Chemical Mechanical Polishing (CMP) can be used to planarize the amorphous silicon surface to achieve the desired roughness.

Example 5

200 mm silicon wafer with resistivity 3000 Ohm-cm is selected as handle substrate for SOI fabrication. 1.5 um epitaxial layer of SiGe is grown in an epitaxial low pressure CVD reactor at 650° C. using source gases $SiH_4$ and $GeH_4$. No special attention is required to control the crystal structure of the epitaxial layer. The handle substrate is bonded to a donor wafer.

The donor wafer selected is boron doped with resistivity of 10-20 Ohm-cm. Before bonding, the donor wafer receives thermal oxidation in wet oxygen at 1000° C. to obtain 0.4 um oxide thickness. Then, ion implantation of with $He^+$ and $H_2^+$ ions is conducted to the dose of about $1 \times 10^{16}$ $ions/cm^2$ and energy of 80 keV. Finally, before the bonding the donor wafer is annealed at 400° C. for 30 minutes.

The handle substrate and the donor wafer are bonded at the surfaces of the epitaxial layer and thermal oxide correspondingly. To improve the bonding strength, both surfaces are activated in nitrogen plasma.

The donor wafer is mechanically cleaved by pulling its backside from the handle substrate fixed on a vacuum chuck. A thin silicon layer and the thermal oxide from the donor wafer are left on the surface of the handle substrate. The transferred silicon layer is thinned to a desired thickness by dry etch in HCl gas at the temperature of about 1050° C. in an epitaxial reactor.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A multilayer structure comprising, in order:
a single crystal silicon wafer handle substrate comprising two major, generally parallel surfaces, one of which is an oxidized front surface of the single crystal silicon wafer handle substrate and the other of which is a back surface of the single crystal silicon wafer handle substrate, a circumferential edge joining the oxidized front and back surfaces of the single crystal silicon wafer handle substrate, and a central plane of the single crystal silicon wafer handle substrate between the oxidized front surface and back surface of the single crystal silicon wafer handle substrate, wherein the single crystal silicon wafer handle substrate comprises a p-type dopant, has <100> crystal orientation and has a bulk resistivity between about 750 ohm-cm and about 100,000 Ohm-cm;
a charge trapping layer in interfacial contact with the oxidized front surface of the single crystal silicon wafer handle substrate;
an intermediate semiconductor layer having electron affinity lower than that of the single crystal silicon wafer handle substrate, wherein the intermediate semiconductor layer is in interfacial contact with the front surface of the charge trapping layer and further wherein the intermediate semiconductor layer comprises a polycrystalline, amorphous, nanocrystalline, or monocrystalline structure and comprising a material selected from the group consisting of a group IIIA-nitride, a metal oxide, and any combination thereof, wherein the group IIIA-nitride is selected from the group consisting of GaN, AlN, InN, BN, and $Al_{1-x-y-z}Ga_xIn_yB_zN$, wherein x, y, and z are molar ratios with values between 0.1 and 0.9 and further wherein the metal oxide is selected from the group consisting of $SnO_2$, $TiO_2$, and ZnO;
a semiconductor oxide layer in interfacial contact with the intermediate semiconductor layer; and
a single crystal silicon device layer in interfacial contact with the semiconductor oxide layer.

2. The multilayer structure of claim 1 wherein the single crystal silicon wafer handle substrate comprises a single crystal silicon wafer having <100> crystal orientation and is sliced from a single crystal silicon ingot grown by the Czochralski method or the float zone method.

3. The multilayer structure of claim 1 wherein the single crystal silicon wafer handle substrate has a bulk resistivity between about 1000 Ohm-cm and about 10,000 Ohm-cm.

4. The multilayer structure of claim 1 wherein the single crystal silicon wafer handle substrate has a bulk resistivity between about 2000 Ohm-cm and about 10,000 Ohm-cm.

5. The multilayer structure of claim 1 wherein the single crystal silicon wafer handle substrate has a bulk resistivity between about 3000 Ohm-cm and about 5,000 Ohm-cm.

6. The multilayer structure of claim 1 wherein the intermediate semiconductor layer comprises a strained intermediate semiconductor layer.

7. The multilayer structure of claim 1 wherein the intermediate semiconductor layer comprises a partially relaxed intermediate semiconductor layer.

8. The multilayer structure of claim 1 wherein the intermediate semiconductor layer comprises a fully relaxed intermediate semiconductor layer.

9. The multilayer structure of claim 1 wherein the intermediate semiconductor layer has a thickness of between about 1 nanometer and about 2000 nanometers.

10. The multilayer structure of claim 1 wherein the intermediate semiconductor layer having electron affinity lower than that of the single crystal semiconductor handle substrate comprises the group IIIA-nitride selected from the group consisting of GaN, AlN, InN, BN, and $Al_{1-x-y-z}Ga_xIn_yB_zN$, wherein x, y, and z are molar ratios with values between 0.1 and 0.9.

11. The multilayer structure of claim 1 wherein the intermediate semiconductor layer having electron affinity lower than that of the single crystal semiconductor handle substrate comprises the group IIIA-nitride selected from the group consisting of GaN, AlN, InN, BN, and $Al_{1-x-y-z}Ga_xIn_yB_zN$, wherein x, y, and z are molar ratios with values between 0.2 and 0.7.

12. The multilayer structure of claim 1 wherein the intermediate semiconductor layer comprises the metal oxide selected from the group consisting of $SnO_2$, $TiO_2$, and ZnO.

13. The multilayer structure of claim 1 wherein the intermediate semiconductor layer further comprises implanted boron.

14. The multilayer structure of claim 1 wherein the intermediate semiconductor layer further comprises implanted argon.

15. A multilayer structure comprising, in order:
a single crystal silicon wafer handle substrate comprising two major, generally parallel surfaces, one of which is an oxidized front surface of the single crystal silicon wafer handle substrate and the other of which is a back surface of the single crystal silicon wafer handle substrate, a circumferential edge joining the oxidized front and back surfaces of the single crystal silicon wafer handle substrate, and a central plane of the single crystal silicon wafer handle substrate between the oxidized front surface and back surface of the single crystal silicon wafer handle substrate, wherein the single crystal silicon wafer handle substrate comprises a p-type dopant, has <100> crystal orientation and has a bulk resistivity between about 750 ohm-cm and about 100,000 Ohm-cm;
an intermediate semiconductor layer having electron affinity lower than that of the single crystal silicon wafer handle substrate, wherein the intermediate semiconductor layer is in interfacial contact with the oxidized front surface of the single crystal silicon wafer handle substrate and further wherein the intermediate semiconductor layer comprises a polycrystalline, amorphous, nanocrystalline, or monocrystalline structure and comprising a material selected from the group consisting of a group IIIA-nitride, a metal oxide, and any combination thereof, wherein the group IIIA-nitride is selected from the group consisting of GaN, AlN, InN, BN, and $Al_{1-x-y-z}Ga_xIn_yB_zN$, wherein x, y, and z are molar ratios with values between 0.1 and 0.9 and further wherein the metal oxide is selected from the group consisting of $SnO_2$, $TiO_2$, and ZnO;
a charge trapping layer in interfacial contact the intermediate semiconductor layer;
a semiconductor oxide layer in interfacial contact with the charge trapping layer; and
a single crystal silicon device layer in interfacial contact with the semiconductor oxide layer.

16. The multilayer structure of claim 15 wherein the single crystal silicon wafer handle substrate has a bulk resistivity between about 1000 Ohm-cm and about 10,000 Ohm-cm.

17. The multilayer structure of claim 15 wherein the intermediate semiconductor layer comprises a strained intermediate semiconductor layer.

18. The multilayer structure of claim 15 wherein the intermediate semiconductor layer comprises a partially relaxed intermediate semiconductor layer.

19. The multilayer structure of claim 15 wherein the intermediate semiconductor layer comprises a fully relaxed intermediate semiconductor layer.

20. The multilayer structure of claim 15 wherein the intermediate semiconductor layer having electron affinity lower than that of the single crystal semiconductor handle substrate comprises the group IIIA-nitride selected from the group consisting of GaN, InN, BN, and $Al_{1-x-y-z}Ga_xIn_yB_zN$, wherein x, y, and z are molar ratios with values between 0.1 and 0.9.

21. The multilayer structure of claim 15 wherein the intermediate semiconductor layer having electron affinity lower than that of the single crystal semiconductor handle substrate comprises the group IIIA-nitride selected from the group consisting of GaN, AlN, InN, BN, and $Al_{1-x-y-z}Ga_xIn_yB_zN$, wherein x, y, and z are molar ratios with values between 0.2 and 0.7.

22. The multilayer structure of claim 15 wherein the intermediate semiconductor layer comprises the metal oxide selected from the group consisting of $SnO_2$, $TiO_2$, and ZnO.

* * * * *